(12) United States Patent
Foong et al.

(10) Patent No.: US 10,527,646 B2
(45) Date of Patent: Jan. 7, 2020

(54) KELVIN CONTACT ASSEMBLY AND METHOD OF INSTALLATION THEREOF

(71) Applicant: JF MICROTECHNOLOGY SDN. BHD., Petaling Jaya, Selangor (MY)

(72) Inventors: Wei Kuong Foong, Petaling Jaya (MY); Kok Sing Goh, Petaling Jaya (MY); Shamal Mundiyath, Petaling Jaya (MY); Eng Kiat Lee, Petaling Jaya (MY)

(73) Assignee: JF MICROTECHNOLOGY SDN. BHD., Petaling Jaya (MY)

( * ) Notice: Subject to any disclaimer, the term of this patent is extended or adjusted under 35 U.S.C. 154(b) by 207 days.

(21) Appl. No.: 15/438,721

(22) Filed: Feb. 21, 2017

(65) Prior Publication Data
US 2017/0242055 A1 Aug. 24, 2017

(30) Foreign Application Priority Data

Feb. 22, 2016 (MY) .......................... PI 2016000320

(51) Int. Cl.
| | |
|---|---|
| *G01R 1/04* | (2006.01) |
| *H01L 21/66* | (2006.01) |
| *H01L 23/522* | (2006.01) |
| *H01L 23/528* | (2006.01) |

(52) U.S. Cl.
CPC ............ *G01R 1/0466* (2013.01); *H01L 22/34* (2013.01); *H01L 23/528* (2013.01); *H01L 23/5226* (2013.01)

(58) Field of Classification Search
None
See application file for complete search history.

(56) References Cited

U.S. PATENT DOCUMENTS

| | | | | |
|---|---|---|---|---|
| 5,329,227 | A * | 7/1994 | Sinclair | G01R 1/0433 324/756.02 |
| 5,865,639 | A * | 2/1999 | Fuchigami | G01R 1/0466 361/709 |
| 7,963,796 | B2 * | 6/2011 | Sypolt | H01R 12/58 439/511 |
| 8,475,178 | B2 * | 7/2013 | Lin | G01R 1/0408 439/66 |
| 2009/0311890 | A1 * | 12/2009 | Nakayama | G01R 1/07371 439/91 |

(Continued)

FOREIGN PATENT DOCUMENTS

| | | | | |
|---|---|---|---|---|
| JP | 2005062100 A | * | 3/2005 | |
| JP | 2008045986 A | * | 2/2008 | ......... G01R 1/07314 |

*Primary Examiner* — Paresh Patel
(74) *Attorney, Agent, or Firm* — Maschoff Brennan

(57) ABSTRACT

An electrical contact assembly comprised of four identical modules arranged in a four-sided formation. Each module comprises of a bottom housing formed with two rows of through holes to allow a row of front and back contact pairs to be inserted, with separators in between each pair to prevent electrical conductance between the pairs. A top housing is then lowered onto the top of these contact pairs. With the aid of a key tool, the rows of contact pairs are inserted into through holes in the top housing. By virtue of different heights between the front and back rows of through holes, the front and back contact rows are inserted one first, and then the other. This allows for easier installation of an assembly with minimal tolerance accumulation.

4 Claims, 11 Drawing Sheets

(56) References Cited

U.S. PATENT DOCUMENTS

| | | | |
|---|---|---|---|
| 2013/0099810 A1* | 4/2013 | Erdman | G01R 1/0466 |
| | | | 324/754.11 |
| 2019/0064260 A1* | 2/2019 | Foong | G01R 31/2886 |
| 2019/0067861 A1* | 2/2019 | Foong | H01R 13/2435 |

* cited by examiner

KELVIN CONTACT ASSEMBLY AND METHOD OF INSTALLATION THEREOF

FIELD OF INVENTION

The present invention relates to an electrical contact assembly in an integrated circuit testing apparatus, and a method of installation thereof.

BACKGROUND OF INVENTION

Kelvin contact testing in integrated circuit (IC) testing apparatuses typically use cantilever type contacts, where the contacts are formed as cantilevers, and part assembly types, where both contacts are assembled over an electrical insulator. With both these types, there is typically high accumulated tolerances, making assembly for fine pitching difficult.

Furthermore, assemblies that use housings to secure the cantilever contacts are typically complex and difficult to install. The end result is a long installation time that results in more downtime.

Another problem of cantilever contact designs for kelvin testing apparatuses is that they produce wide tolerances that lead to uneven kelvin gaps and over-wiping issues on the device pads, as well as burr collision on the pin tips. Cantilever contact designs also have an issue with pin co-planarity. When cantilever pins are cut to shape, that creates its own tolerance distributions and contributes to unevenness or the so-called piano effect. This is an undesirable output that effects testing negatively.

What is needed in the art is a kelvin contact assembly that overcomes the above disadvantages.

SUMMARY OF INVENTION

The present invention seeks to overcome the aforementioned disadvantages by providing an electrical contact assembly comprised of four identical modules arranged in a four-sided formation. Each module comprises of a bottom housing formed with two rows of through holes to allow a row of front and back contact pairs to be inserted, with separators in between each pair to prevent electrical conductance between the pairs. A top housing is then lowered onto the top of these contact pairs. With the aid of a key tool, the rows of contact pairs are inserted into through holes in the top housing. By virtue of different heights between the front and back rows of through holes, the front and back contact rows are inserted one first, and then the other. This allows for easier installation of an assembly with minimal tolerance accumulation.

In a solution for the above-mentioned uneven gaps and over-wiping issues associated with cantilever contacts, this invention also relates to contacts formed of electrically conductive wires, into a shape in a kelvin solution. This eliminates these issues as the wire diameter tolerances is more constant throughout the profile. As such, the kelvin gap is controlled within the designed output. Holes are drilled to secure the wires as they are round in shape, this too eliminates partially the machining tolerance accumulation and stack-up tolerance issues. The wire goes vertically down thru a hole when compressed, thus producing an extremely short wipe stroke, whereas cantilever style design wipes/forward moved upon compression. This works very well for devices that have short pads.

One aspect of this invention is thus an electrical contact module for use in an integrated circuit testing apparatus. This module comprises of a plurality of front contacts, each front contact having a lower tip and an upper tip; a plurality of back contacts, each back contact having a lower tip and an upper tip, and each back contact paired with one said front contact; a plurality of separators, each separator located in between adjacent pairs of said front and back contacts; a bottom housing having a row of front through holes, each front through hole adapted to receive one said front contact lower tip, and a row of back through holes, each back through hole adapted to receive one said back contact lower tip; and a top housing having a row of front through holes, each front through hole adapted to receive one said front contact upper tip, and a row of back through holes, each back through hole adapted to receive one said back contact upper tip, the bottom openings of said front through holes being lower than the bottom openings of said back through holes.

Another aspect of this invention is an electrical contact assembly for use in an integrated circuit testing apparatus. This assembly comprises: four electrical contact modules arranged one on each side of a four-sided formation, each module comprising: a plurality of front contacts, each front contact having a lower tip and an upper tip; a plurality of back contacts, each back contact having a lower tip and an upper tip, and each back contact paired with one said front contact a plurality of separators, each separator located in between adjacent pairs of said front and back contacts; a bottom housing having a row of front through holes, each front through hole adapted to receive one said front contact lower tip and a row of back through holes, each back through hole adapted to receive one said back contact lower tip; and a top housing having a row of front through holes, each front through hole adapted to receive one said front contact upper tip, and a row of back through holes, each back through hole adapted to receive one said back contact upper tip, the bottom openings of said front through holes being lower than the bottom openings of said back through holes; and a module housing adapted to receive said four-sided formation, and provided with at least one opening on an under side to allow said front contact lower tip and back contact lower tip to peek through.

In a preferred embodiment of this invention, the top openings of the bottom housing front through holes is higher than the top openings of said bottom housing back through holes.

Yet another aspect of this invention is a method of assembling an electrical contact module, comprising the steps of:

(a) inserting a lower tip of a back contact in through the top opening of a back through hole of a bottom housing;

(b) inserting a lower tip of a front contact in through the top opening of a front through hole of said bottom housing, such that the said front contact is substantially aligned with said back contact, forming a pair of contacts;

(c) placing a separator next to said front contact and back contact pair;

(d) inserting a lower tip of a second back contact in through the top opening of a second back through hole of a bottom housing;

(e) inserting a lower tip of a second front contact in through the top opening of a second front through hole of said bottom housing;

(f) placing a second separator next to said second front contact and second back contact pair;

(g) repeating (d), (e) and (f) above until a row of front and back contact pairs, alternating with separators, substantially fill a bottom housing pocket;

(h) using a key tool to align a row of front contact upper tips, said key tool having a comb-like end adapted to align said row of front contact upper tips;

(i) lowering a top housing onto said rows of contact pairs, such that each of a front contact upper tip is inserted through the bottom opening of a top housing front through hole;

(j) using said key tool to align a row of back contact upper tips; and (k) further lowering said top housing onto said rows of contact pairs, such that each of a back contact upper tip is inserted through the bottom opening of a top housing back through hole.

Yet another aspect of this invention is a method of assembling an electrical contact assembly, comprising the steps of:

(l) arranging four of the modules of steps (a) to (k), one on each side of a four-sided formation; and (m) inserting said four-sided formation into a module housing, said module housing adapted to receive said four-sided formation, and provided with at least one opening on an under side to allow said front contact lower tip and back contact lower tip to peek through.

Other objects and advantages will be more fully apparent from the following disclosure and appended claims.

DETAILED DESCRIPTION OF INVENTION

Figure 1:
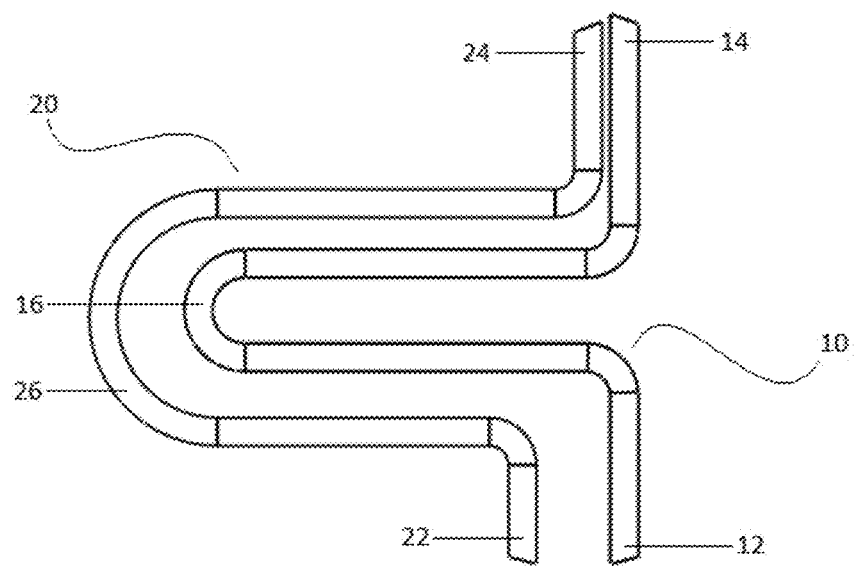
FIG. 1 shows a view of a pair of contacts in an embodiment of this invention

It should be noted that the following detailed description is directed to an electrical contact assembly of an integrated circuit (IC) testing apparatus, and is not limited to any particular size or configuration but in fact a multitude of sizes and configurations within the general scope of the following description.

List of Numbered Elements in Figures
Front contact (10)
Front contact lower tip (12)
Front contact upper tip (14)
Front contact
Back contact (20)
Back contact lower tip (22)
Back contact upper tip (24)
Back contact (20)
Separator (30)
Bottom housing (40)
Bottom housing front lip (42)
Bottom housing front through holes (43)
Bottom housing back lip (44)
Bottom housing back through holes (45)
Bottom housing pocket (46)
Bottom housing dowel holes (48)
Top housing (50)
Top housing front lip (52)
Top housing front through holes (53)
Top housing back lip (54)
Top housing back through holes (55)
Top housing pocket (56)
Top housing dowel pins (58)
Top housing springs (59)
Key tool (60)
Key tool comb (62)
Module housing (70)

Referring to FIG. 1, there is shown a pair of contacts, comprising a front contact (10) and a back contact (20). Both contacts are constructed of a single piece of electrically conductive wire bent to the precise required design of each contact. The front contact (10) has a lower tip (12) and an upper tip (14) joined by a C-shaped body portion (16). The back contact (20) also has a lower tip (22) and an upper tip (24) joined by a C-shaped body portion (26). The body portion (26) of the back contact (20) has a larger diameter curve in comparison to the front contact (10). As seen in FIG. 1, these contacts are thus paired with each other, with the lower tips (12, 22) at a slightly further distance apart than are the upper tips (14, 24).

Figure 2A:
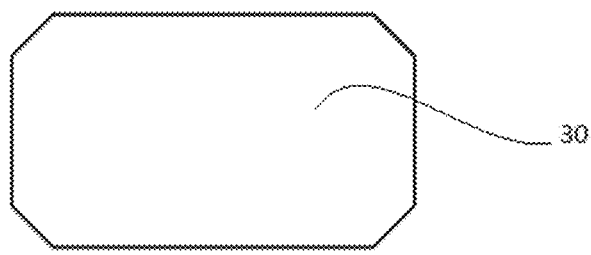
FIGS. 2a and 2b show views of a separator in an embodiment of this invention
Figure 2B:
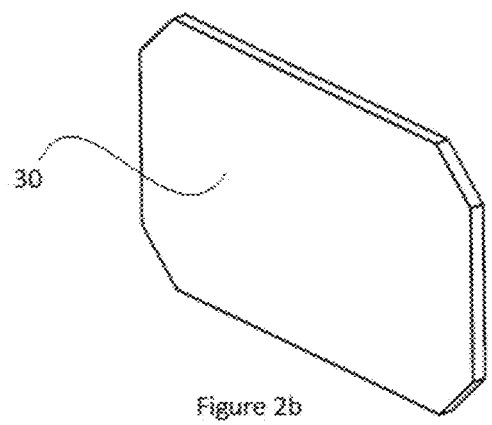

Referring to FIGS. 2a and 2b, there is shown a separator (30). This separator (30) is a flat, thin, rectangular panel made of a dielectric material. Each corner of the panel is chamfered.

Figure 3A:
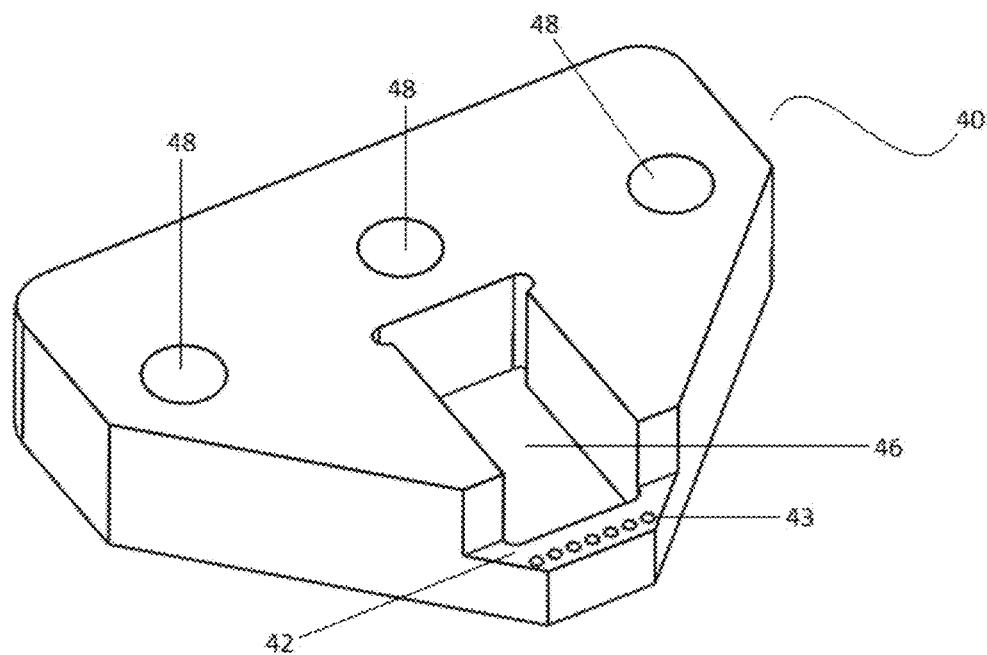
FIGS. 3a, 3b and 3c show views of a bottom housing in an embodiment of this invention
Figure 3B:
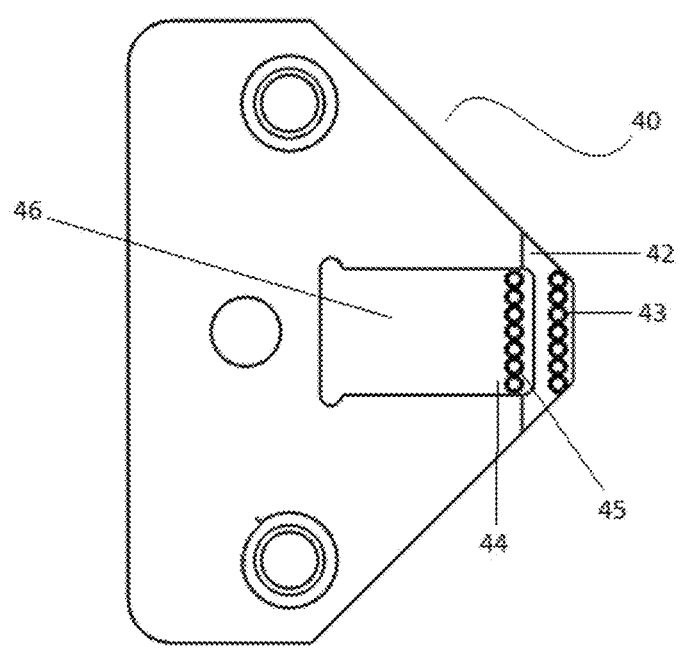
Figure 3C:
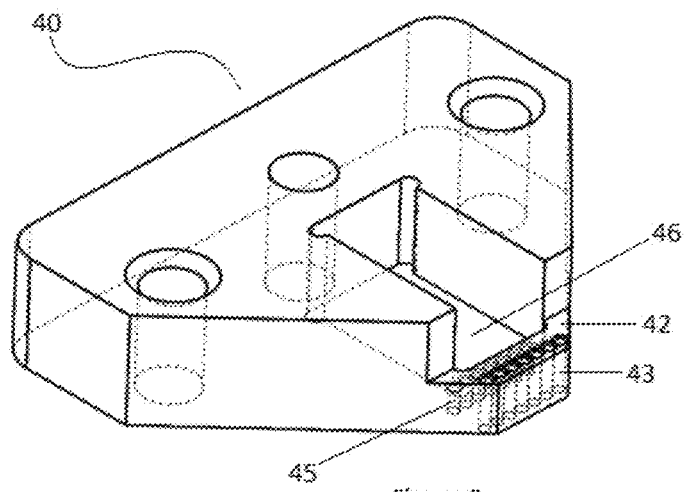
Figure 4A:
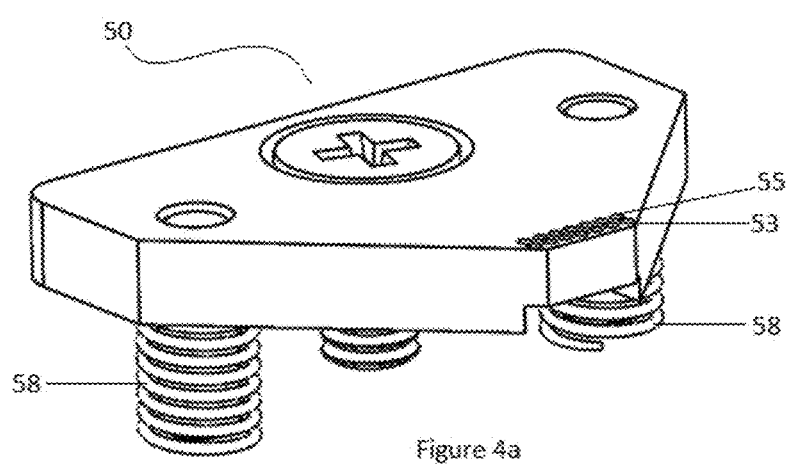
FIGS. 4a through 4e show views of a top housing in an embodiment of this invention
Figure 4B:
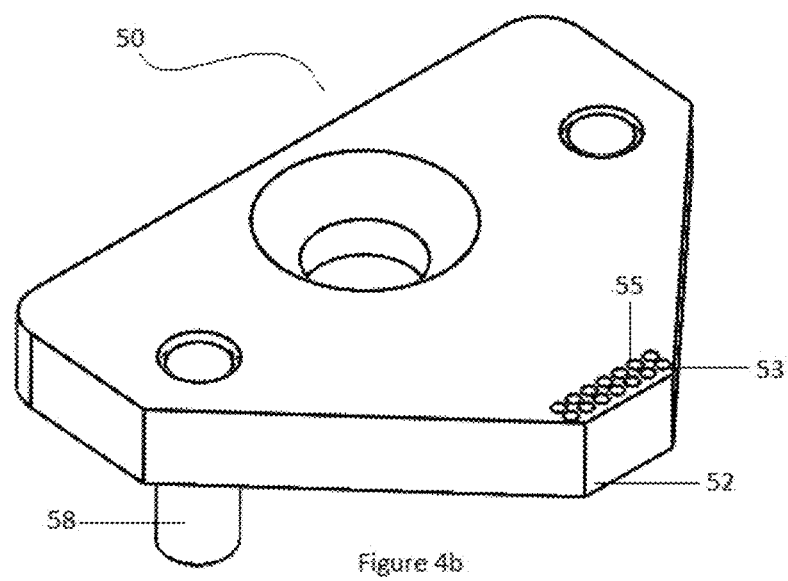
Figure 4C:
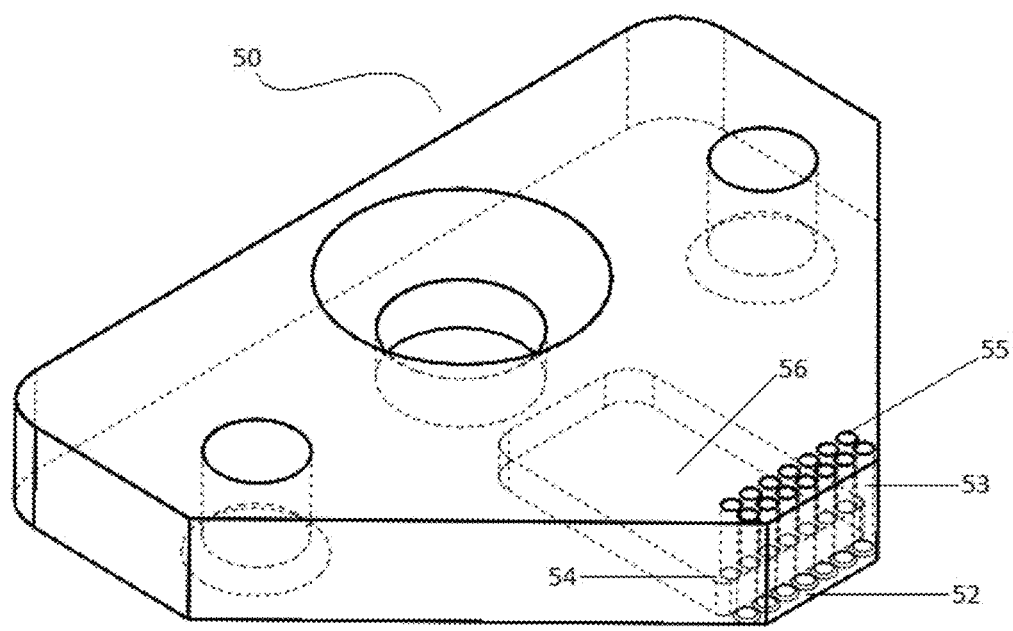
Figure 4D:
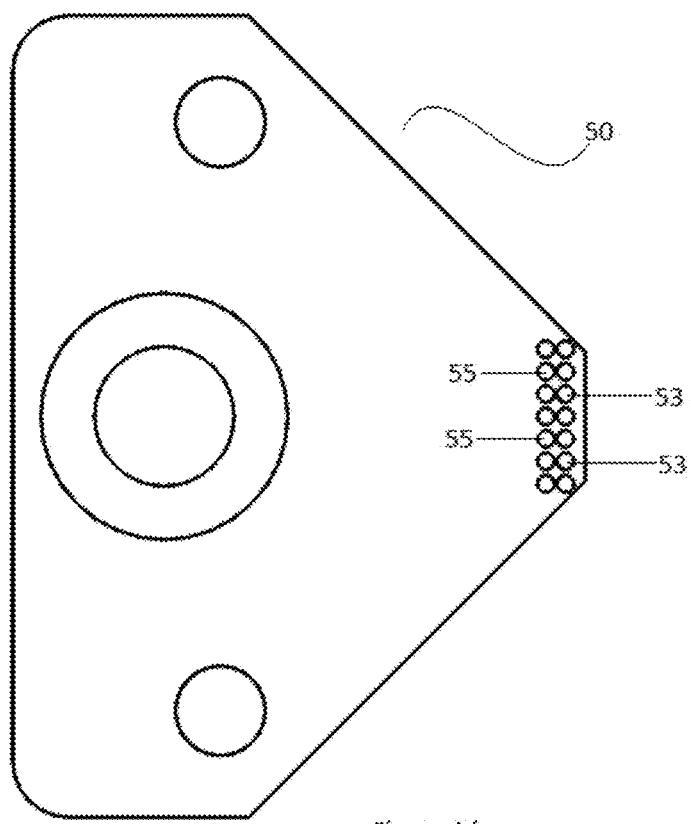
Figure 4E:
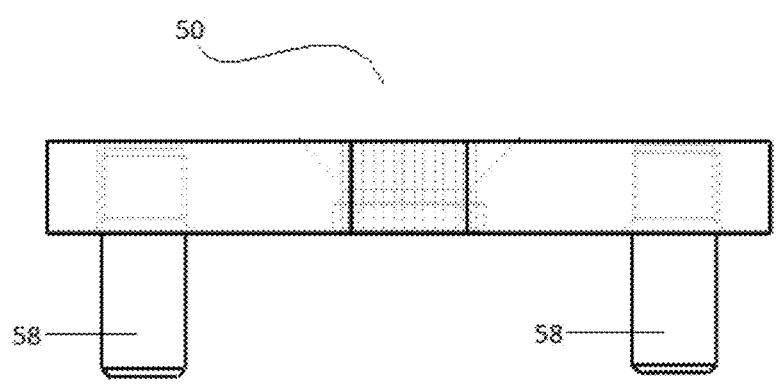
Figure 5A:
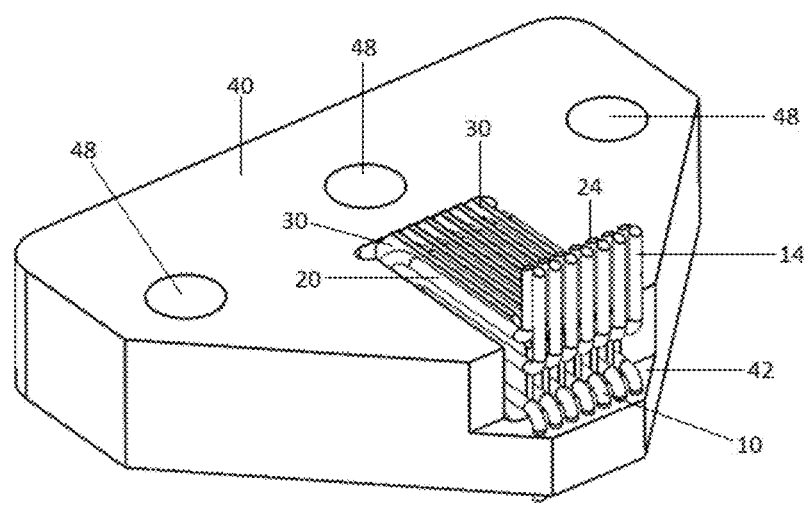
FIGS. 5a through 5e show views of an installation method in an embodiment of this invention
Figure 5B:
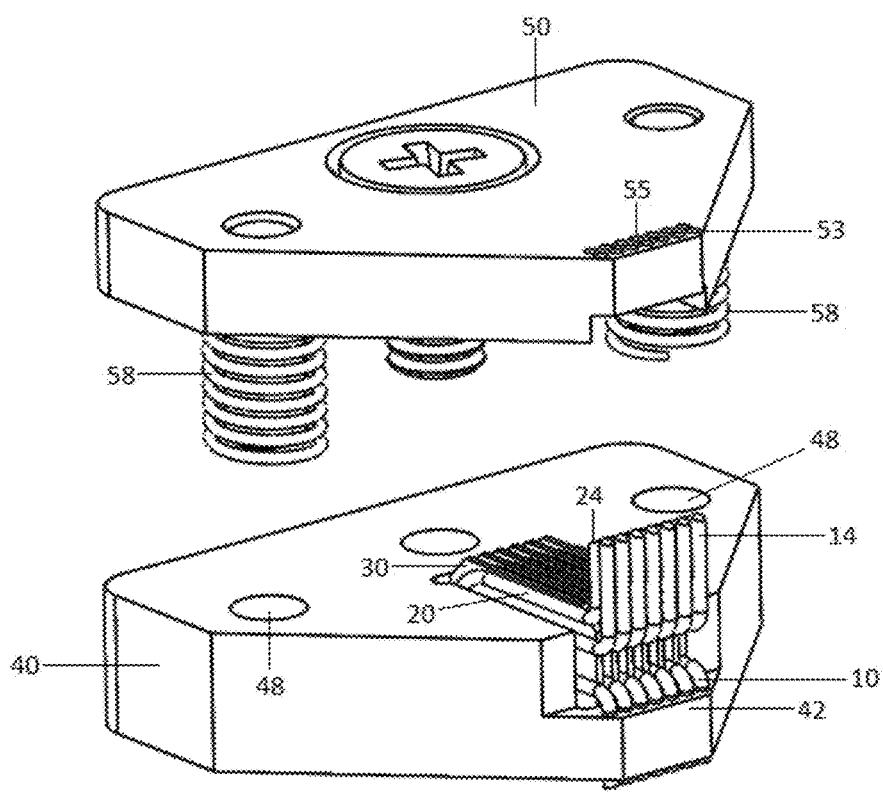
Figure 5C:
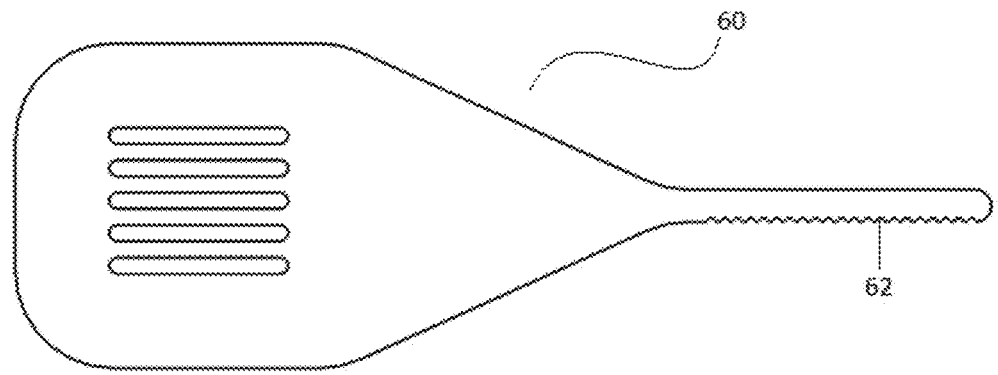
Figure 5D:
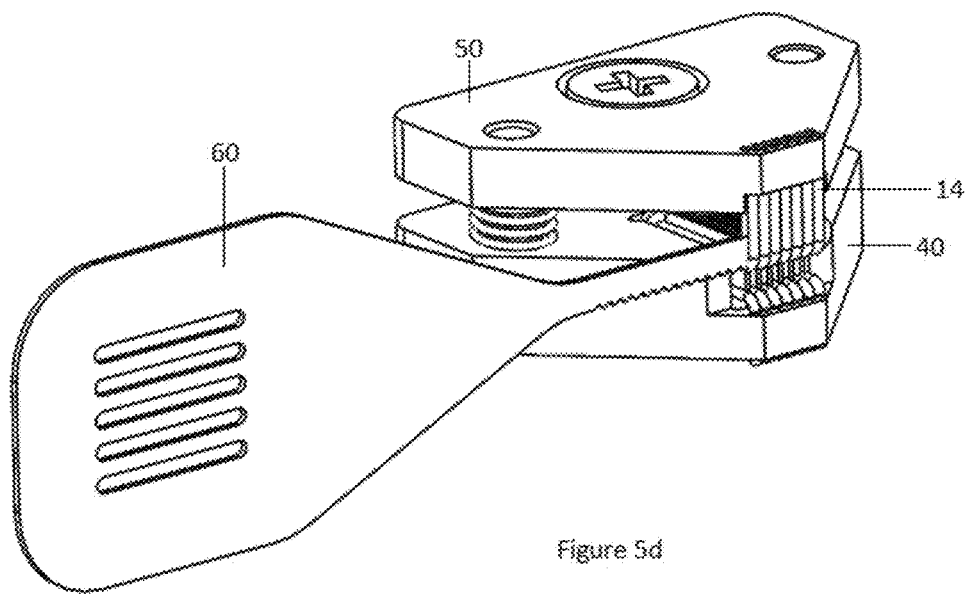
Figure 5E:
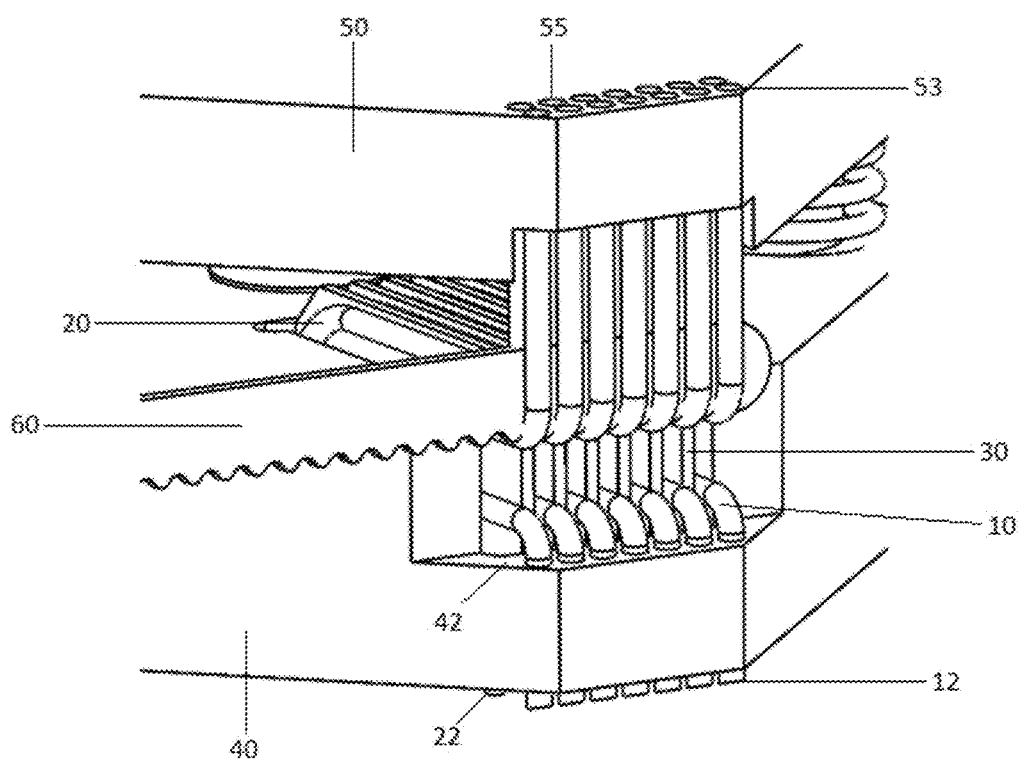

Referring to FIGS. 3a, 3b and 3c, there is shown a bottom housing (40). The bottom housing (40) is a block of dielectric material with deep chamfers cut out at two adjacent corners. There is a front lip (42) provided on the edge of the side which lies in between the two chamfered corners. Along this front lip (42) is provided a row of front through holes (43). These front through holes (43) pass all the way from the top to the bottom of the bottom housing (40). There is also a pocket (46) cut out the top of this bottom housing in between where the two chamfered corners are, just inside of the said front lip (42). A floor of this pocket (46) is lower in height than the said front lip (42). A row of back through holes (45) is provided on a portion of this pocket (46) known as a back lip (44). This row of back through holes (45) is parallel and equal in number to the said row of front through holes (43). These back through holes (45) pass all the way from the top of the back lip (44) to the bottom of the bottom housing (40). However, since the back lip (44) is thinner than the front lip (42), these back through holes (45) are shorter than the front through holes (43). The bottom housing (40) is provided with dowel holes (48) for receiving dowel pins located on a top housing (shown in FIGS. 4a through 4d).

FIGS. 4a through 4e show a top housing (50) of this invention. This top housing (50) is similar in shape to the said bottom housing (40). This top housing (50) is a block of dielectric material with deep chamfers cut out at two adjacent corners. There is a front lip (52) provided on the edge of the side which lies in between the two chamfered corners. Along this front lip (52) is provided a row of front through holes (53). These front through holes (53) pass all the way from the bottom to the top of the top housing (50). There is also a pocket (56) cut out the bottom of this top housing in between where the two chamfered corners are, just inside of the said front lip (52). A ceiling of this pocket (56) is higher in height than the said front lip (52). A row of back through holes (55) is provided on a portion of this pocket known as a back lip (54). This row of back through holes (55) is parallel and equal in number to the said row of front through holes (53). These back through holes (55) pass all the way from the bottom of the back lip (54) to the top of the top housing (50). However, since the back lip (54) is thinner than the front lip (52), these back through holes (55) are shorter than the front through holes (53). The top housing (50) is provided with dowel pins (58) that match with the dowel holes (48) in the bottom housing (40) so that as the top housing (50) is lowered onto the bottom housing (40), the dowel pins (58) pass into the dowel holes (48). The top housing (50) is also provided with springs (59) wrapped around the dowel pins (58) for providing a retention force between the top housing (50) and bottom housing (40) during installation.

FIGS. 5*a* through 5*e* show a method of installing a module of this invention. First, a lower tip (22) of a back contact (20) is inserted in through the top opening of a back through hole (45) of the bottom housing (40). Next, a lower tip (12) of a front contact (10) is inserted in through the top opening of a front through hole (43) of said bottom housing (40), such that the said front contact (10) is substantially aligned with said back contact (20), forming a pair of contacts. A row of these front through holes (43) is provided on a front lip (42) on the bottom housing (40). Next, a separator (30) is placed next to said front contact (10) and back contact (20) pair. Next, a lower tip (22) of a second back contact (20) is inserted in through the top opening of a second back through hole (45) of a bottom housing (40). Next, a lower tip (12) of a second front contact (10) is inserted in through the top opening of a second front through hole (43) of said bottom housing (40). Next, a second separator (30) is placed next to said second front contact (10) and second back contact (20) pair. This is repeated, until a row of front and back contact pairs, alternating with separators (30), substantially fill a bottom housing pocket (46).

Next, a key tool (60) is used to align a row of front contact upper tips (14), said key tool (60) having a comb-like end (62) adapted to align said row of front contact upper tips (14). Next, a top housing (50) is lowered onto said rows of contact pairs, such that each of a front contact upper tip (14) is inserted through the bottom opening of a top housing front through hole (53). Next, said key tool (60) is used to align a row of back contact upper tips (24). Next, said top housing (50) is further lowered onto said rows of contact pairs, such that each of a back contact upper tip (24) is inserted through the bottom opening of a top housing back through hole (55). The top housing (50) is provided with dowel pins (58) that match with the dowel holes (48) in the bottom housing (40) so that as the top housing (50) is lowered onto the bottom housing (40), the dowel pins (58) pass into the dowel holes (48). The top housing (50) is also provided with springs (59) wrapped around the dowel pins (58) for providing a retention force between the top housing (50) and bottom housing (40) during installation.

Because the front through holes (53) start lower than the back through holes (55), they receive the upper tips (14) of the front contacts (10) before the back through holes (55) receive the upper tips (24) of the back contacts (20). This allows one key tool (60) to be used to align one row of contacts at a time.

Figure 6A:
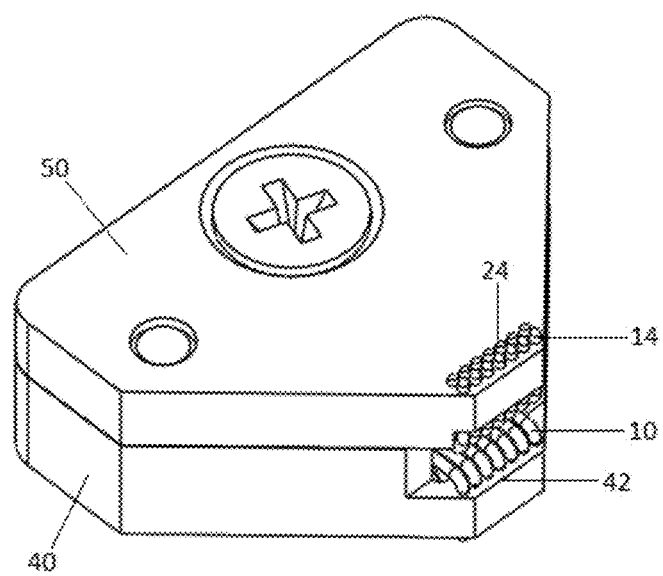
FIGS. 6a and 6b show views of a module in an embodiment of this invention
Figure 6B:
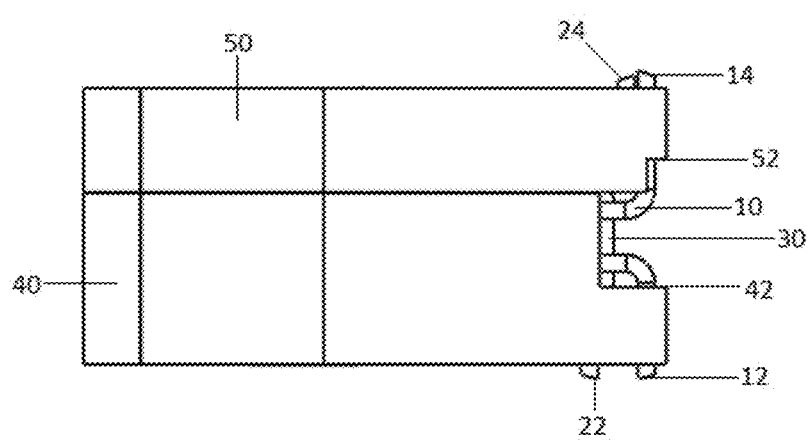

FIGS. 6*a* and 6*b* show views of a module of this invention. There is a bottom housing (40) and top housing (50) pressed together to contain front contacts (10) and back contacts (20). The front (10) and back (20) contacts form contact pairs, each said pair separated by a separator (30). The front contact (10) has a lower tip (12) and an upper tip (14). The back contact (20) has a lower tip (22) and an upper tip (24). The bottom housing has a front lip (42) and a back lip (not shown). The top housing has a front lip (52) and a back lip (not shown).

Figure 7A:
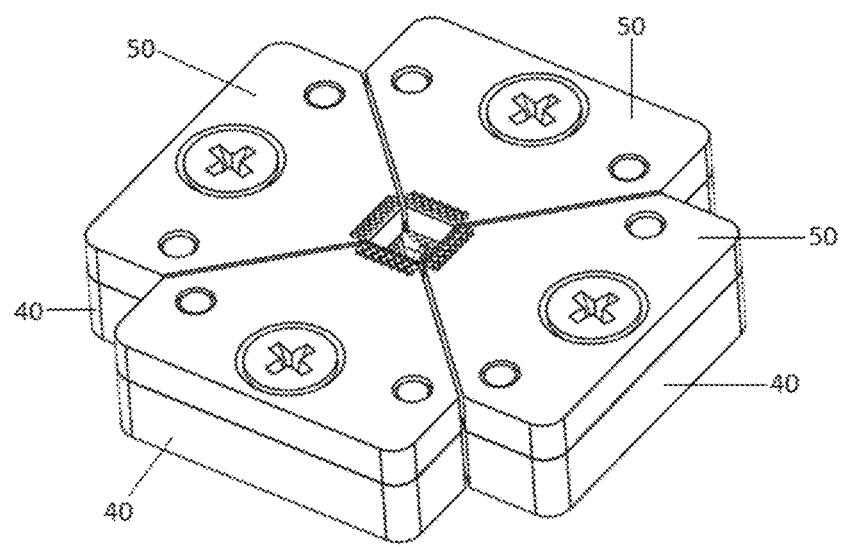
FIGS. 7a and 7b show views of an assembly in an embodiment of this invention
Figure 7B:
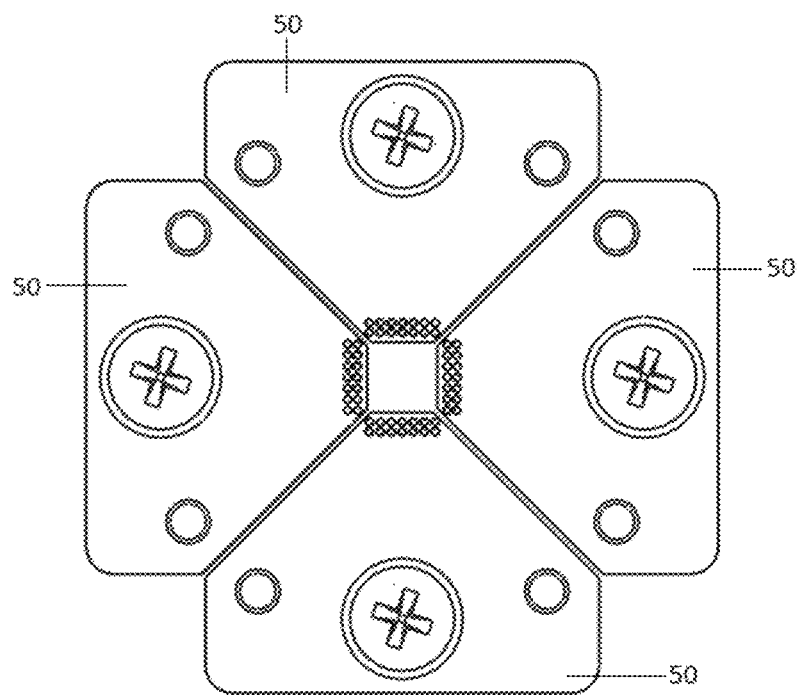

FIGS. 7*a* and 7*b* show an assembly of this invention, with four modules arranged together in a four-sided formation with 4 bottom housings (40) and 4 top housings (50). The electrical contacts converge towards the center of the assembly.

Figure 8:
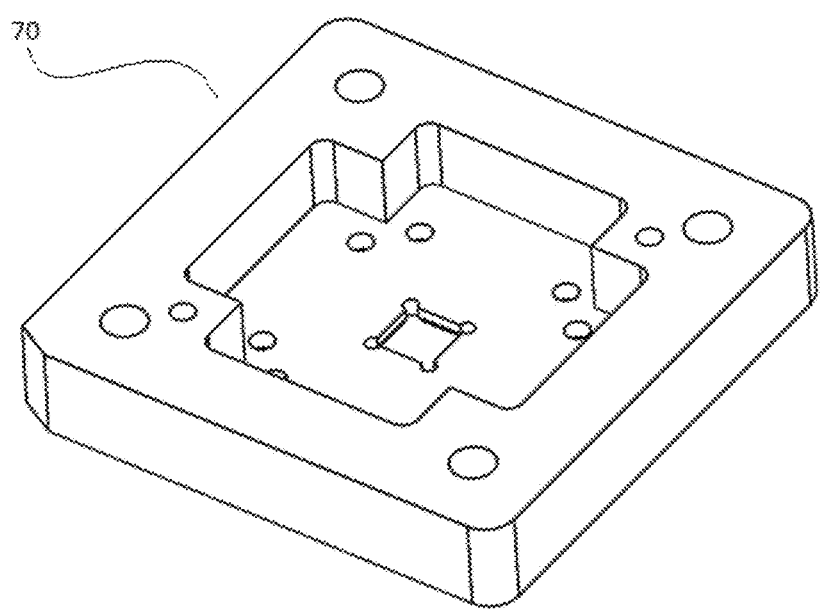
FIG. 8 shows a view of a module housing in an embodiment of this invention

FIG. 8 shows a module housing (70) which houses the four-sided formation.

While several particularly preferred embodiments of the present invention have been described and illustrated, it should now be apparent to those skilled in the art that various changes and modifications can be made without departing from the spirit and scope of the invention. Accordingly, the following claims are intended to embrace such changes, modifications, and areas of application that are within the scope of this invention.

The invention claimed is:

1. An electrical contact module for use in an integrated circuit testing apparatus, comprising:
   a plurality of front contacts, each front contact formed of an electrically conductive wire and having a lower tip and an upper tip joined by a C-shaped body portion;
   a plurality of back contacts, each back contact formed of an electrically conductive wire and having a lower tip and an upper tip joined by a C-shaped body portion, and each back contact paired with one said front contact;
   a plurality of separators, each separator located in between adjacent pairs of said front and back contacts;
   a bottom housing having a row of front through holes, each front through hole adapted to receive one said front contact lower tip, and a row of back through holes, each back through hole adapted to receive one said back contact lower tip, the bottom housing enclosing the plurality of separators in a bottom housing pocket; and
   a top housing having a row of front through holes, each front through hole adapted to receive one said front contact upper tip, and a row of back through holes, each back through hole adapted to receive one said back contact upper tip, the bottom openings of said front through holes being lower than the bottom openings of said back through holes,
   wherein said C-shaped body portions of the front and back contacts provide a spring action and thus vertical movement of the upper tips and lower tips within said through holes.

2. An electrical contact module for use in an integrated circuit testing apparatus in accordance with claim 1, wherein the top openings of said bottom housing front through holes being higher than the top openings of said bottom housing back through holes.

3. An electrical contact assembly for use in an integrated circuit testing apparatus, comprising:
   four electrical contact modules arranged one on each side of a four-sided formation, each module comprising:
      a plurality of front contacts, each front contact formed of an electrically conductive wire and having a lower tip and an upper tip joined by a C-shaped body portion;

a plurality of back contacts, each back contact formed of an electrically conductive wire and having a lower tip and an upper tip joined by a C-shaped body portion, and each back contact paired with one said front contact;
a plurality of separators, each separator located in between adjacent pairs of said front and back contacts;
a bottom housing having a row of front through holes, each front through hole adapted to receive one said front contact lower tip, and a row of back through holes, each back through hole adapted to receive one said back contact lower tip, the bottom housing enclosing the plurality of separators in a bottom housing pocket; and
a top housing having a row of front through holes, each front through hole adapted to receive one said front contact upper tip, and a row of back through holes, each back through hole adapted to receive one said back contact upper tip, the bottom openings of said front through holes being lower than the bottom openings of said back through holes; and
a module housing adapted to receive said four-sided formation, and provided with at least one opening on an under side to allow said front contact lower tip and back contact lower tip to peek through,
wherein said C-shaped body portions of the front and back contacts provide a spring action and thus vertical movement of the upper tips and lower tips within said through holes.

4. An electrical contact assembly for use in an integrated circuit testing apparatus in accordance with claim 3, wherein the top openings of said bottom housing front through holes being higher than the top openings of said bottom housing back through holes.

* * * * *